(12) United States Patent
Harihara Gupta et al.

(10) Patent No.: US 12,403,920 B2
(45) Date of Patent: Sep. 2, 2025

(54) MAINTENANCE OF AUTONOMOUS VEHICLE TESTS

(71) Applicant: GM Cruise Holdings LLC, San Francisco, CA (US)

(72) Inventors: Omnaath Guptha Harihara Gupta, Livermore, CA (US); Michael Toyama, Belmont, CA (US); Priti Maheswari, Fremont, CA (US)

(73) Assignee: GM Cruise Holdings, LLC, San Francisco, CA (US)

( * ) Notice: Subject to any disclaimer, the term of this patent is extended or adjusted under 35 U.S.C. 154(b) by 358 days.

(21) Appl. No.: 17/953,106

(22) Filed: Sep. 26, 2022

(65) Prior Publication Data
US 2024/0101130 A1    Mar. 28, 2024

(51) Int. Cl.
*G06F 11/36* (2025.01)
*B60W 50/02* (2012.01)
*B60W 50/04* (2006.01)

(52) U.S. Cl.
CPC ........ *B60W 50/04* (2013.01); *B60W 50/0205* (2013.01); *B60W 50/0225* (2013.01); *B60W 2420/403* (2013.01); *B60W 2420/408* (2024.01)

(58) Field of Classification Search
CPC ............ B60W 50/04; B60W 50/0205; B60W 50/0225; B60W 2420/403; B60W 2420/408; G06F 30/20; G06F 11/3692; G06F 11/3664
USPC .......................................................... 701/25
See application file for complete search history.

(56) References Cited

U.S. PATENT DOCUMENTS

2023/0059562 A1\* 2/2023 Chan ...................... G06F 30/15

\* cited by examiner

*Primary Examiner* — Adam R Mott
*Assistant Examiner* — Joseph Anthony Trias
(74) *Attorney, Agent, or Firm* — Honigman LLP; Matthew H. Szalach; Jonathan P. O'Brien (57) ABSTRACT

The disclosed technology provides solutions for maintaining autonomous vehicle (AV) tests and, provides methods for evaluating test relevance and for determining how to fix outdated AV tests. In some aspects, a process of the disclosed technology includes steps for associating a set of test metrics with an AV test, monitoring operation of an AV to identify one or more behaviors performed by the AV in the simulated environment and determining a validity of the AV test with respect to the simulated environment based on the AV behaviors and the set of test metrics. Systems and machine-readable media are also provided.

17 Claims, 7 Drawing Sheets

MAINTENANCE OF AUTONOMOUS VEHICLE TESTS

BACKGROUND

1. Technical Field

The disclosed technology provides solutions for maintaining autonomous vehicle (AV) tests and in particular, provides methods for evaluating test relevance and for determining how to fix outdated tests.

2. Introduction

Autonomous vehicles (AVs) are vehicles having computers and control systems that perform driving and navigation tasks conventionally performed by human drivers. As AV technologies continue to advance, are increasingly used to improve transportation efficiency and safety. As such, AVs need to perform many of the functions typically performed by human drivers. Such tasks may require the collection and processing of large quantities of data using various sensor types, including but not limited to cameras, Radio Detection and Ranging (RADAR) sensors, and/or Light Detection and Ranging (LiDAR) sensors disposed on the AV. In some instances, the collected data can be used by the AV to perform tasks relating to routing, planning, and obstacle avoidance. To ensure safe and efficient operation these various AV systems require extensive testing and training.

BRIEF DESCRIPTION OF THE DRAWINGS

Certain features of the subject technology are set forth in the appended claims. However, the accompanying drawings, which are included to provide further understanding, illustrate disclosed aspects and together with the description explain the principles of the subject technology. In the drawings:

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a more thorough understanding of the subject technology. However, it will be clear and apparent that the subject technology is not limited to the specific details set forth herein and may be practiced without these details. In some instances, structures and components are shown in block diagram form to avoid obscuring certain concepts.

One aspect of the present technology is the gathering and use of data available from various sources to improve quality and experience. The present disclosure contemplates that in some instances, this gathered data may include personal information. The present disclosure contemplates that the entities involved with such personal information respect and value privacy policies and practices.

To ensure adequate safety and performance, autonomous vehicles (AVs) must undergo extensive testing before they can be deployed in real-world settings. In some instances, AV performance can be evaluated using AV tests designed to determine if the AV can adequately perform under certain conditions, such as by safely and efficiently navigating different driving scenarios. As used herein, AV tests can include a set of programmatic routines or applications that are designed to verify and/or evaluate the performance of specific AV behaviors and/or characteristics, for example, when AV operations are performed in a simulated test environment. As such, AV tests can be used to validate the successful completion of any number of a variety of AV behaviors or maneuvers (e.g., the completion of a full stop, a successful unprotected left-turn maneuver, etc.) under various conditions. Additionally, AV tests may be used to check on the occurrence (or non-occurrence) of specific events during a given test scenario. By way of example, AV tests may be configured to check for the occurrence of a collision with other entities (e.g., vehicles and/or pedestrians), or entry into non-drivable areas (e.g., driving up on curb sides) in the simulated environment. Additionally, in some implementations, tests can be used to verify where and/or when an AV is exhibiting 'asserting' behavior, as opposed to 'stopped' behavior, e.g., to determine where the AV is actively engaging traffic situations and successfully navigating scene conditions, and where the AV is stopped or is in a holding pattern of non-engagement. In some implementations, AV tests may also be used to identify when or where emergency stops (or safe stops) are triggered, for example, to identify instances where the AV has encountered a scenario that it may have difficulty navigating or where the AV has encountered a dangerous situation.

One limitation in the use of AV tests is that tests can become less effective (or obsolete) over time, for example, due to changes in AV software (e.g., changes/updates to the AV stack), and/or due to changes in the (simulated) environment in which the tests are applied/run. Additionally, as the number of available tests increases, it becomes progressively difficult for technicians to determine what tests remain valid and which have become obsolete, as well as to identify which invalid tests may be fixed with minimal updates.

Aspects of the disclosed technology provide solutions for evaluating AV test relevance and for identifying outdated (or atrophied) AV tests. Additionally, the disclosed technology provides solutions for identifying outdated/atrophied AV tests that may be easily repaired or updated, for example, by modifying an evaluation window associated with the test that identifies a specific time-period (e.g., a start-time and end-time) of AV operation for which the test can be applied.

In some approaches, AV test maintenance can be facilitated using pre-defined test intent metrics (also referred to as: test metrics or intent metrics) that can be used to determine or quantify how closely an AV followed a desired intent path when navigating a provided test scenario. Test metrics can define one or more target AV behaviors to be evaluated by a given AV test. As used herein, AV behaviors can be (or may include) various vehicle maneuvers (e.g., turns, lane changes, velocity changes, etc.) and/or changes to the AV trajectory/route, etc. Test metrics can be associated with a given AV test, along with a predefined intent path, for example, that specifies a time-series of AV positions (e.g., an AV trajectory) and/or behaviors to be evaluated by a given test. As such, test metrics can be used to provide a means to evaluate a degree to which an AV performance in each test scenario adhered to the intent path. A set of test metrics can depend on (and correspond with) the associated intent path of the AV. For example, the intent path may identify a time-series of AV behaviors or maneuvers that are to occur at different times (or locations) along an AV's trajectory through a driving scene. By way of example, the intent path may specify an ordering of AV behaviors (e.g., stop, turn left, and then park-at-destination, etc.), as well as times and/or regions/zones within the driving scene where each behavior/maneuver is to be performed.

Test intent metrics can consist of or otherwise include a predefined set of criteria—for each AV behavior/maneuver along the intent path—that can provide quantitative measures of (1) whether the AV successfully completed the intended behavior or maneuver, and (2) how well the maneuver or behavior was executed. By way of example, test metrics can include metrics relating to vehicle kinematics, such as velocity, acceleration (e.g., longitudinal and/or lateral acceleration), lane identifiers indicating locations of the AV on specific road segments, and the like.

Figure 1:
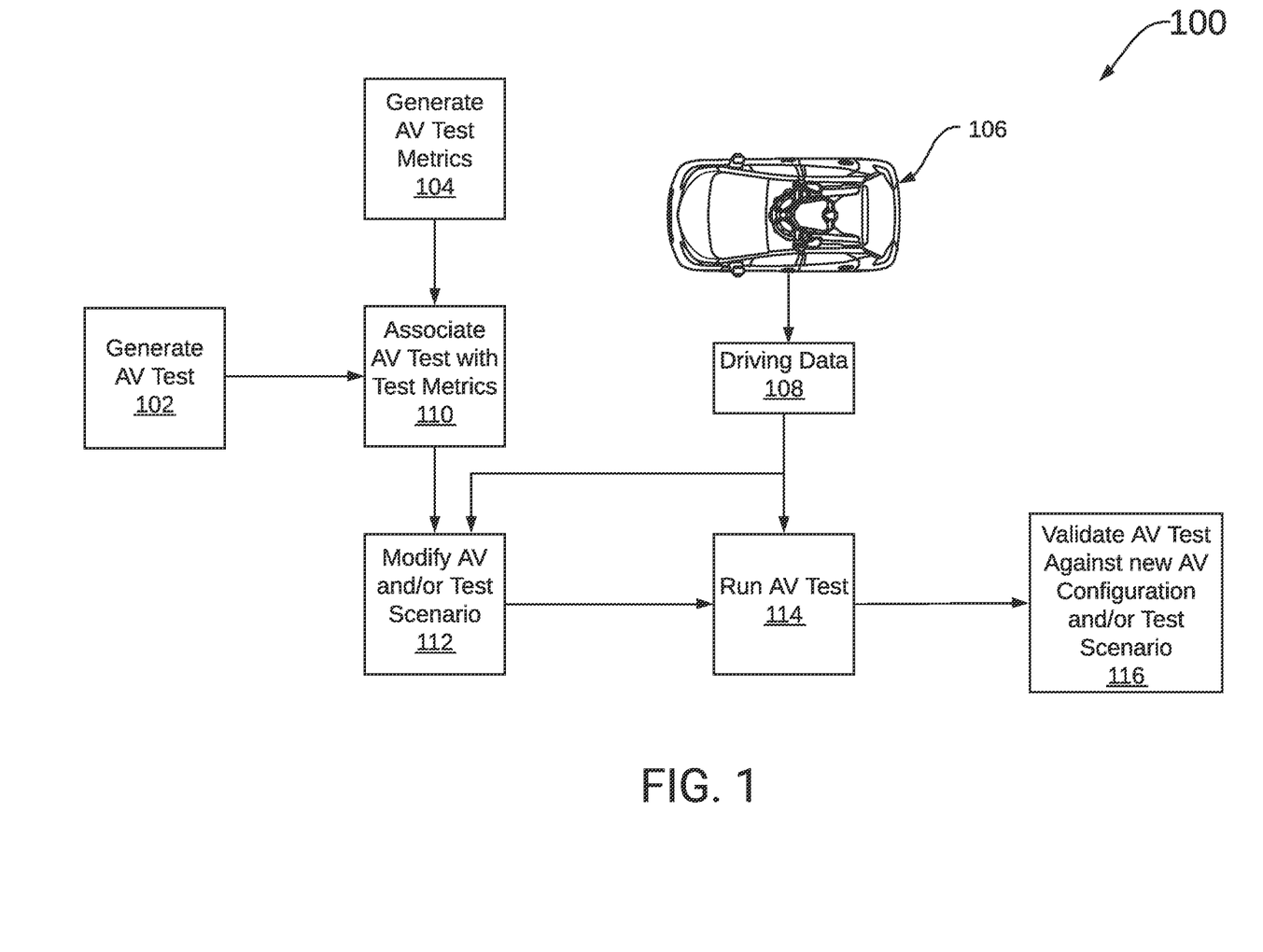
FIG. 1 illustrates a simplified block diagram of a system for validating autonomous vehicle (AV) tests using various AV test metrics, according to some aspects of the disclosed technology.

FIG. 1 illustrates a block diagram of an example system 100 for validating autonomous vehicle (AV) tests using various AV test metrics. As illustrated in the example of FIG. 1, AV test generation 102 can be performed in a manner such that the test is designed to provide a set of criteria (e.g., AV behaviors and/or maneuvers) to be tested with respect to the AV. By way of example, an AV test may include programmatic code or other instructions that are configured to monitor outputs at various layers of an AV stack during a simulated operation of the AV, e.g., in a simulated environment or virtual driving scenario. The test may include checks to determine the occurrence (or non-occurrence) of specific events, such as collisions, dangerous maneuvers by the AV (e.g., driving into non-drivable areas), and/or the performance of other specific maneuvers or behaviors, e.g., stops, turns, lane changes, speed changes, and/or acceleration changes, etc.

For each test, a set of specific (and possibly unique) test metrics can be designated (block 104). The test metrics can provide a way to evaluate AV performance with respect to a given test, i.e., how well (or how closely) the AV adhered to an intent path. Depending on the desired implementation, test metrics may provide or indicate quantitative measures for adherence to a specific intent characteristic. By way of example, if a given intent path indicates a stop at a particular location, the intent metric may include a binary indicator (e.g., a yes/no or zero/one that the stop was performed). By way of further example, if the intent path specifies a range of vehicle speeds or headings, then the intent metric may be similarly represented, e.g., as a range of speeds or vehicle headings. In other instances, intent metrics may be represented as a probability, e.g., on an interval of [0, 1], where 0 represents a low (or 0%) probability of event occurrence, and a 1 represents a high certainty (100%) of event occurrence. Event probabilities can be used to quantify probabilities or likelihoods of certain events, such as that the AV will collide with another entity along its trajectory, and/or than an entity will move into a path of the AV, etc. The test metrics and the intent path can be associated with the AV test (block 110), for example, so that each test can be associated with a set of criteria that can be used to determine the validity of the associated test.

At block 112, modifications can be made to the AV software, such as changes/upgrades to the AV stack. Additionally, block 112 can include changes to a synthetic scene in which AV performance may be evaluated. Such changes can cause the originally generated test (block 102) to become outdated or obsolete for the intended purpose; as such, the intent metrics can be used to determine how well an AV (e.g., AV 106) is able to adhere to a defined intent path. By way of example, driving data 108 collected from AV 106 can be used to run an AV test (block 114). In some instances, the AV test may be run in a replay scenario where operation of AV 106 is simulated against an environment recorded by the AV sensors and that is represented in driving data 108. As such, driving data 108 can include recorded sensor data for various locations or scenarios previously encountered by the AV 106. However, updates or other changes to software of the AV 106 can be tested using the AV test at block 114. Subsequently, a performance of the AV 106 in the test scenario can be validated at block 116.

In another example, an AV test may be run (block 114) to test a new driving scenario, for example, that is different from that represented by driving data 108. In such instances, the performance of AV 106 in the new (synthetic or virtual) driving scenario can also be validated using the test metrics (from block 104) to validate how well the AV 106 was able to adhere to an intent path associated with the AV test. In some approaches, test metrics may be used to indicate how closely a path or trajectory of AV 106 in the synthetic driving scenario matches a path/trajectory of the AV 106 represented in driving data 108. By way of example, a root mean square (RMS) calculation may be used to determine Euclidean distances between locations and/or poses of AV 106 represented by driving data 108 against those identified in the synthetic driving scenario.

Figure 2:
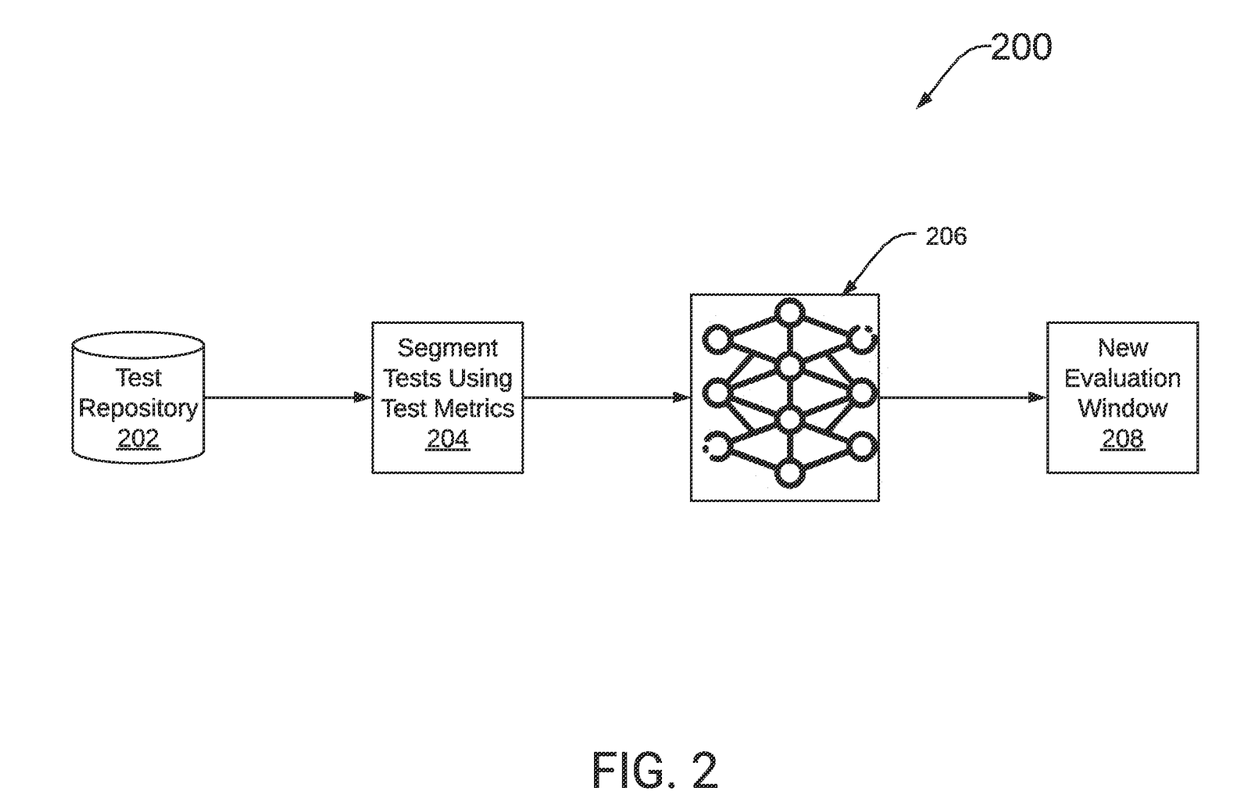
FIG. 2 illustrates a simplified block diagram of an example system for fixing or updating one or more outdated AV tests, according to some aspects of the disclosed technology.

FIG. 2 illustrates a simplified block diagram of an example system 200 for fixing or updating one or more outdated AV tests. System 200 includes a test repository 202 that is configured to store a multitude of AV tests, e.g., that have been created for the purpose of testing various AV systems and/or behaviors, as discussed above with respect to block 102 in FIG. 1. The test repository can be used to identify/segment tests using their associated test metrics (block 204). In some approaches, AV operation can be simulated in a (synthetic) environment and test metrics can be collected with respect to the administered test. That is, the test metrics can be used at block 204 to identify which tests in test repository 202 may be outdated (or atrophied) and may need to be updated. By way of example, segmentation of tests from test repository 202 can be based on a predetermined test metric threshold, below which, the test may be identified as 'out-of-date' or in need of revision.

The AV tests identified and segmented at block 204 may be analyzed to determine if they can be easily revised/updated, e.g., to be brought up-to-date based on changes to the AV software and/or synthetic scenario in which the test is conducted. In some approaches, a machine-learning model 206 may be used to determine/identify which of the segmented tests may be updated. For example, the machine-learning model 206 may be trained to identify AV tests that may be brought up to date by modifying one or more specific parameters, such as an evaluation window in which the test is applied. By way of example, machine-learning model 206 may be configured to process those tests from repository 202 that have test metrics below a predetermined threshold (e.g., indicating that they are out of date), and, for each test, determine a probability that the test can be brought up-to-date through modification of an associated evaluation window. By way of example, the evaluation window can identify a specific time-period (e.g., a start-time and end-time) of AV operation for which the test can be applied.

Figure 3:
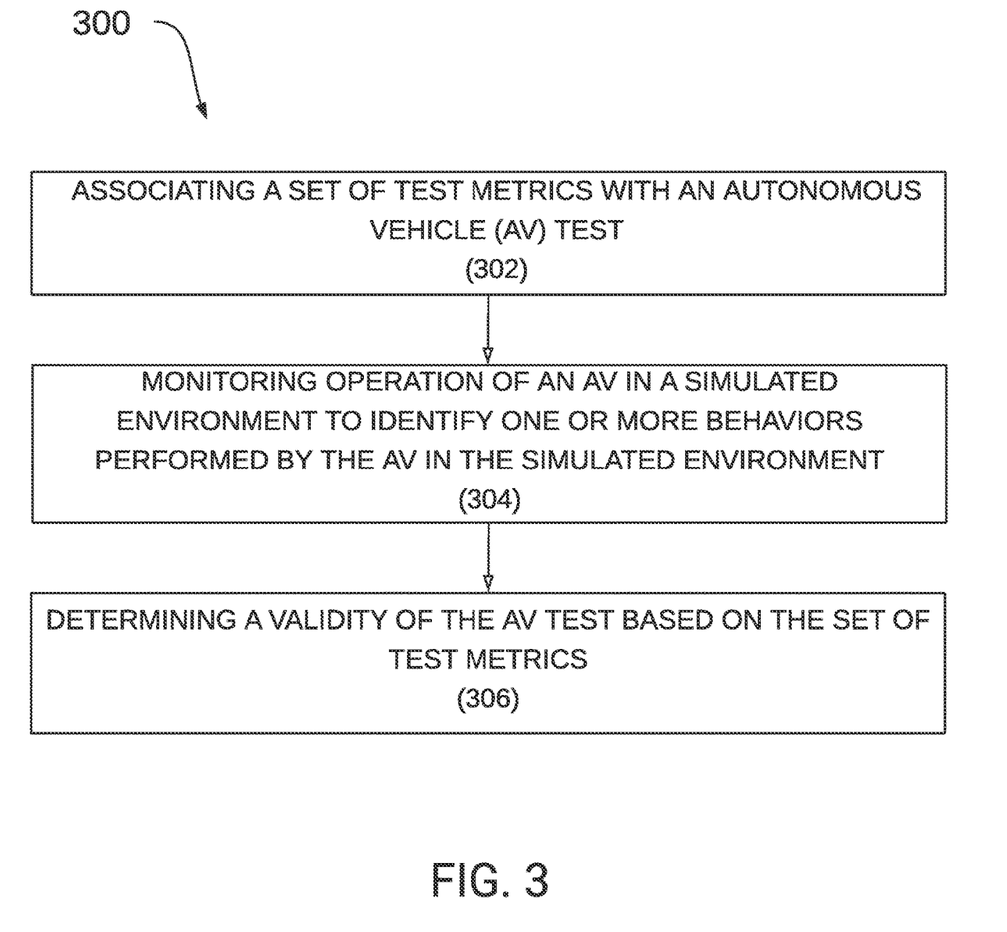
FIG. 3 illustrates a flow diagram of an example process for validating AV tests using test metrics, according to some aspects of the disclosed technology.

FIG. 3 illustrates a flow diagram of an example process 300 for validating AV tests using associated test metrics. At step 302, the process 300 includes associating a set of test metrics with an autonomous vehicle (AV) test. Test metrics can be used to evaluate or quantify a performance of the AV with respect to an intent-path for an applied AV test. As discussed above, the intent path can specify a trajectory (or time-series) of AV positions/locations and/or behaviors with respect to a given AV test.

At step 304, the process 300 includes monitoring operation of an AV to identify one or more behaviors performed by the AV in the simulated environment. As discussed above, the test metrics can be used to evaluate the AV's adherence to a predefined intent path, such as the completion of one or more intended events, behaviors and/or tasks along the intent path. By way of example, the intent path may specify a particular route or trajectory of the AV, along which, the AV is intended to perform specific maneuvers, such as turns and/or lane changes etc. In this example, a lower test-metric scoring may indicate a low adherence to the defined intent path, e.g., that the AV was unable to adhere to the intended trajectory and/or unable to complete one or more of the defined behaviors (maneuvers) specified by the test. Conversely, a higher test metric scoring may indicate a high adherence to the defined intent path, e.g., that the AV correctly navigated the intended trajectory/path and completed the requisite behaviors/maneuvers defined by the path.

At step 306, process 300 includes determining a validity of the AV test based on the set of test metrics. The validity of the AV test may be determined based on the test metrics resulting from simulation of the AV using a given AV test (e.g., step 304, discussed above). By way of example, a particular AV test may be determined to be out-of-date or obsolete if the metrics resulting from application of the test are not reproducible, if they indicate a failure to meet the test intent, or if they indicate erroneous results.

By way of example, if an AV test is designed to check a path or trajectory of an AV through a given driving scenario, but test metrics for repeated applications of the test do not correspond (e.g., the test metrics are different between test instances), then the AV test may be determined to be invalid, i.e., faulty or obsolete. In another example, if an AV test is designed to verify certain maneuvers (e.g., turns or stops) performed by the AV and the test metrics indicate that the AV was stopped or stuck in a single location, then it may be determined, based on the test metrics, that the test is invalid, e.g., for failing to achieve the test intent.

Figure 4:
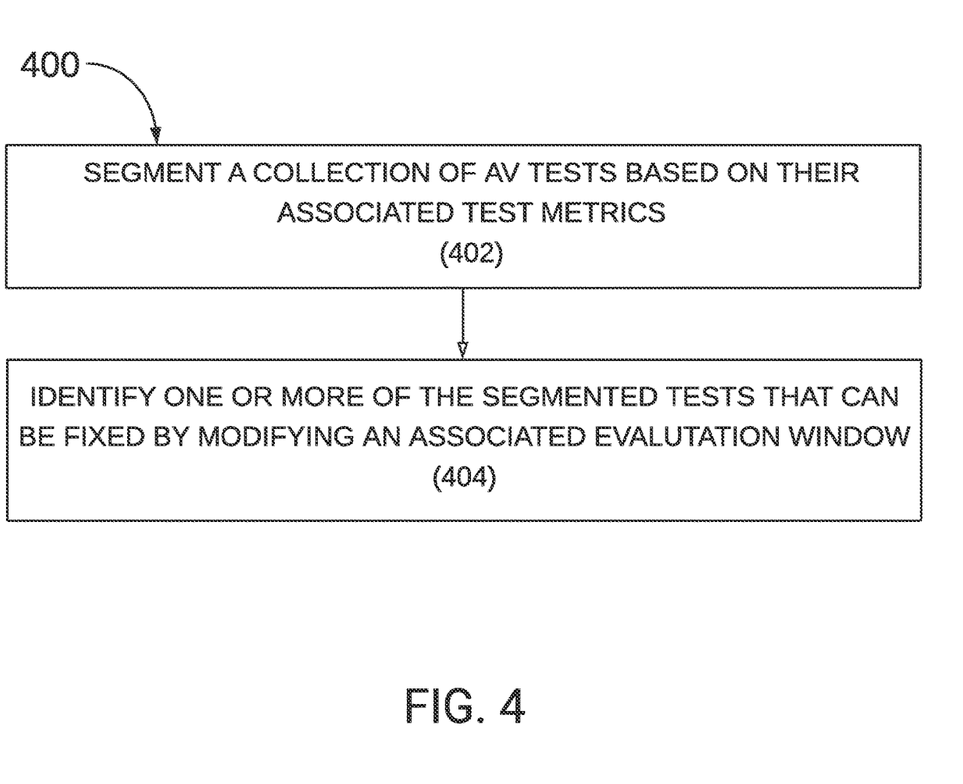
FIG. 4 illustrates a flow diagram of an example process for updating AV tests, according to some aspects of the disclosed technology.

FIG. 4 illustrates a flow diagram of an example process 400 for updating AV tests. At step 402, the process 400 includes segmenting two or more AV tests based on associated test metrics. As discussed above with respect to FIG. 2, test metrics can be evaluated for several tests, using various AV software versions and/or synthetic test scenarios. Based on the test metrics for each test, a determination can be made as to whether a given test is up-to-date, or if it is out-of-date and needs to be revised. By way of example, AV tests with test metric scores below a predetermined threshold may be segmented or selected for potential revision or update, whereas tests having metrics above the threshold may be left unaltered.

At step 404, the process 400 includes identifying one or more of the segmented tests that can be fixed/updated by modifying an associated evaluation window. As such, the test database can be first segmented according to test metrics associated with each test (step 402), and then further segmented based on an identification of which of (pre-segmented) tests may be updated by modifying an associated evaluation window. By way of example, some of the segmented tests (which may be identified as obsolete or out of date) may be fixable by altering the evaluation window in which the test is applied, for example, by changing either the start time or end time of the test application with respect to the AV simulation.

In some aspects, identification of tests that can be fixed/updated may be performed using a machine-learning model. As discussed above with respect to FIG. 3, a machine-learning model that has been trained to identify fixable/upgradeable tests can be used to assist with test segmentation. In some instances, tests may be updated, for example, by modifying an evaluation window associated with the test, e.g., to change the time period in which the test is applied to the AV simulation.

In instances where one or more machine-learning models are used to determine the feasibility of test repair or update, the machine-learning models may be trained using sets of training data that include a multitude of tests and their associated test metrics. That is, the machine-learning model may be trained based on test/test metric pairs, e.g., to identify (or classify) test instances that can be repaired through modification of evaluation window parameters. Further details regarding the implementation of machine learning models are provided with respect to FIG. 5, discussed below.

Figure 5:
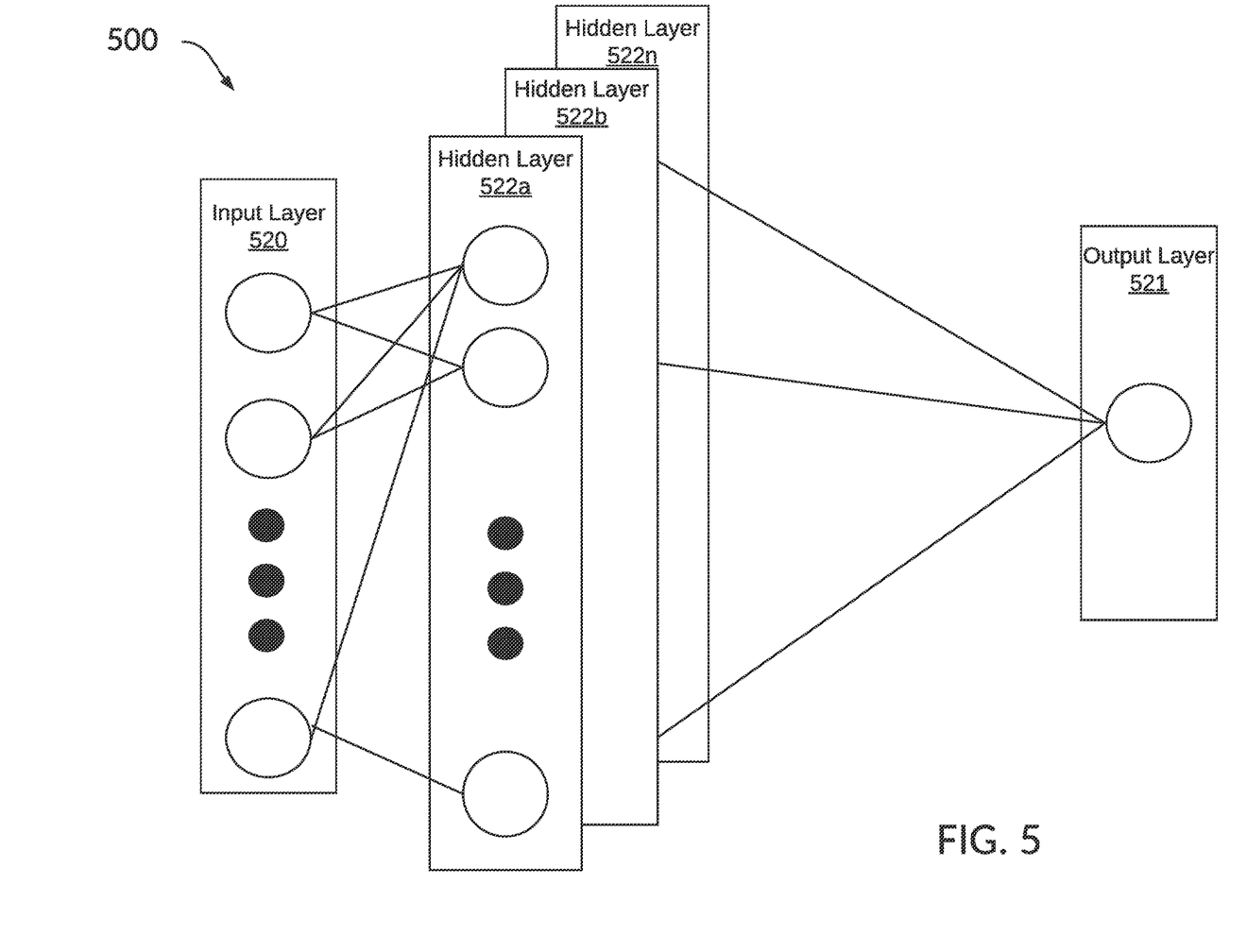
FIG. 5 illustrates an example architecture of a machine-learning model, according to some aspects of the disclosed technology.

FIG. 5 is an illustrative example of a deep learning neural network 500 that can be implemented to facilitate a process for updating one or more AV tests. In one illustrative example, the input layer 520 can be configured to receive test data and/or associated test metric data associated with a given AV test, and at output layer 521 output an indication as to whether the inputted test can be updated by modifying an evaluation window. In some examples, the output layer 521 may be configured to output a new evaluation window (e.g., a start time and an end time) that could be used to fix or update a corresponding test. The neural network 500 includes multiple hidden layers 522a, 522b, through 522n. The hidden layers 522a, 522b, through 522n include "n" number of hidden layers, where "n" is an integer greater than or equal to one. The number of hidden layers can be made to include as many layers as needed for the given application. The neural network 500 further includes an output layer 521 that provides an output resulting from the processing performed by the hidden layers 522a, 522b, through 522n.

The neural network 500 is a multi-layer neural network of interconnected nodes. Each node can represent a piece of information. Information associated with the nodes is shared among the different layers and each layer retains information as information is processed. In some cases, the neural network 500 can include a feed-forward network, in which case there are no feedback connections where outputs of the network are fed back into itself. In some cases, the neural network 500 can include a recurrent neural network, which can have loops that allow information to be carried across nodes while reading in input.

Information can be exchanged between nodes through node-to-node interconnections between the various layers. Nodes of the input layer 520 can activate a set of nodes in the first hidden layer 522a. For example, as shown, each of the input nodes of the input layer 520 is connected to each of the nodes of the first hidden layer 522a. The nodes of the first hidden layer 522a can transform the information of each input node by applying activation functions to the input node information. The information derived from the transformation can then be passed to and can activate the nodes of the next hidden layer 522b, which can perform their own designated functions. Example functions include convolutional, up-sampling, data transformation, and/or any other suitable functions. The output of the hidden layer 522b can then activate nodes of the next hidden layer, and so on. The output of the last hidden layer 522n can activate one or more nodes of the output layer 521, at which an output is provided. In some cases, while nodes (e.g., node 526) in the neural network 500 are shown as having multiple output lines, a node can have a single output and all lines shown as being output from a node represent the same output value.

In some cases, each node or interconnection between nodes can have a weight that is a set of parameters derived from the training of the neural network 500. Once the neural network 500 is trained, it can be referred to as a trained neural network, which can be used to classify one or more activities. For example, an interconnection between nodes can represent a piece of information learned about the interconnected nodes. The interconnection can have a tunable numeric weight that can be tuned (e.g., based on a training dataset), allowing the neural network 500 to be adaptive to inputs and able to learn as more and more data is processed.

The neural network 500 is pre-trained to process the features from the data in the input layer 520 using the different hidden layers 522a, 522b, through 522n in order to provide the output through the output layer 521. In some cases, the neural network 500 can adjust the weights of the nodes using a training process called backpropagation. As noted above, a backpropagation process can include a forward pass, a loss function, a backward pass, and a weight update. The forward pass, loss function, backward pass, and parameter update is performed for one training iteration. The process can be repeated for a certain number of iterations for each set of training data until the neural network 500 is trained well enough so that the weights of the layers are accurately tuned.

A loss function can be used to analyze error in the output. Any suitable loss function definition can be used, such as a Cross-Entropy loss. Another example of a loss function includes the mean squared error (MSE), defined as $E\_total = \Sigma = (\frac{1}{2}(target-output)^2)$. The loss can be set to be equal to the value of E_total. The goal of training is to minimize the amount of loss so that the predicted output is the same as the training label. The neural network 500 can perform a backward pass by determining which inputs (weights) most contributed to the loss of the network and can adjust the weights so that the loss decreases and is eventually minimized. A derivative of the loss with respect to the weights (denoted as dL/dW, where W are the weights at a particular layer) can be computed to determine the weights that contributed most to the loss of the network. After the derivative is computed, a weight update can be performed by updating all the weights of the filters. For example, the weights can be updated so that they change in the opposite direction of the gradient. The weight update can be denoted as $w = w\_i - \eta\, dL/dW$, where w denotes a weight, wi denotes the initial weight, and η denotes a learning rate. The learning rate can be set to any suitable value, with a high learning rate including larger weight updates and a lower value indicating smaller weight updates.

The neural network 500 can include any suitable deep network. One example includes a convolutional neural network (CNN), which includes an input layer and an output layer, with multiple hidden layers between the input and out layers. The hidden layers of a CNN include a series of convolutional, nonlinear, pooling (for downsampling), and fully connected layers. The neural network 500 can include any other deep network other than a CNN, such as an autoencoder, a deep belief nets (DBNs), a Recurrent Neural Networks (RNNs), among others.

As understood by those of skill in the art, machine-learning based classification techniques can vary depending on the desired implementation. For example, machine-learning classification schemes can utilize one or more of the following, alone or in combination: hidden Markov models; recurrent neural networks; convolutional neural networks (CNNs); deep learning; Bayesian symbolic methods; general adversarial networks (GANs); support vector machines; image registration methods; applicable rule-based system. Where regression algorithms are used, they may include including but are not limited to: a Stochastic Gradient Descent Regressor, and/or a Passive Aggressive Regressor, etc.

Machine learning classification models can also be based on clustering algorithms (e.g., a Mini-batch K-means clustering algorithm), a recommendation algorithm (e.g., a Miniwise Hashing algorithm, or Euclidean Locality-Sensitive Hashing (LSH) algorithm), and/or an anomaly detection algorithm, such as a Local outlier factor. Additionally, machine-learning models can employ a dimensionality reduction approach, such as, one or more of: a Mini-batch Dictionary Learning algorithm, an Incremental Principal Component Analysis (PCA) algorithm, a Latent Dirichlet Allocation algorithm, and/or a Mini-batch K-means algorithm, etc.

Figure 6:
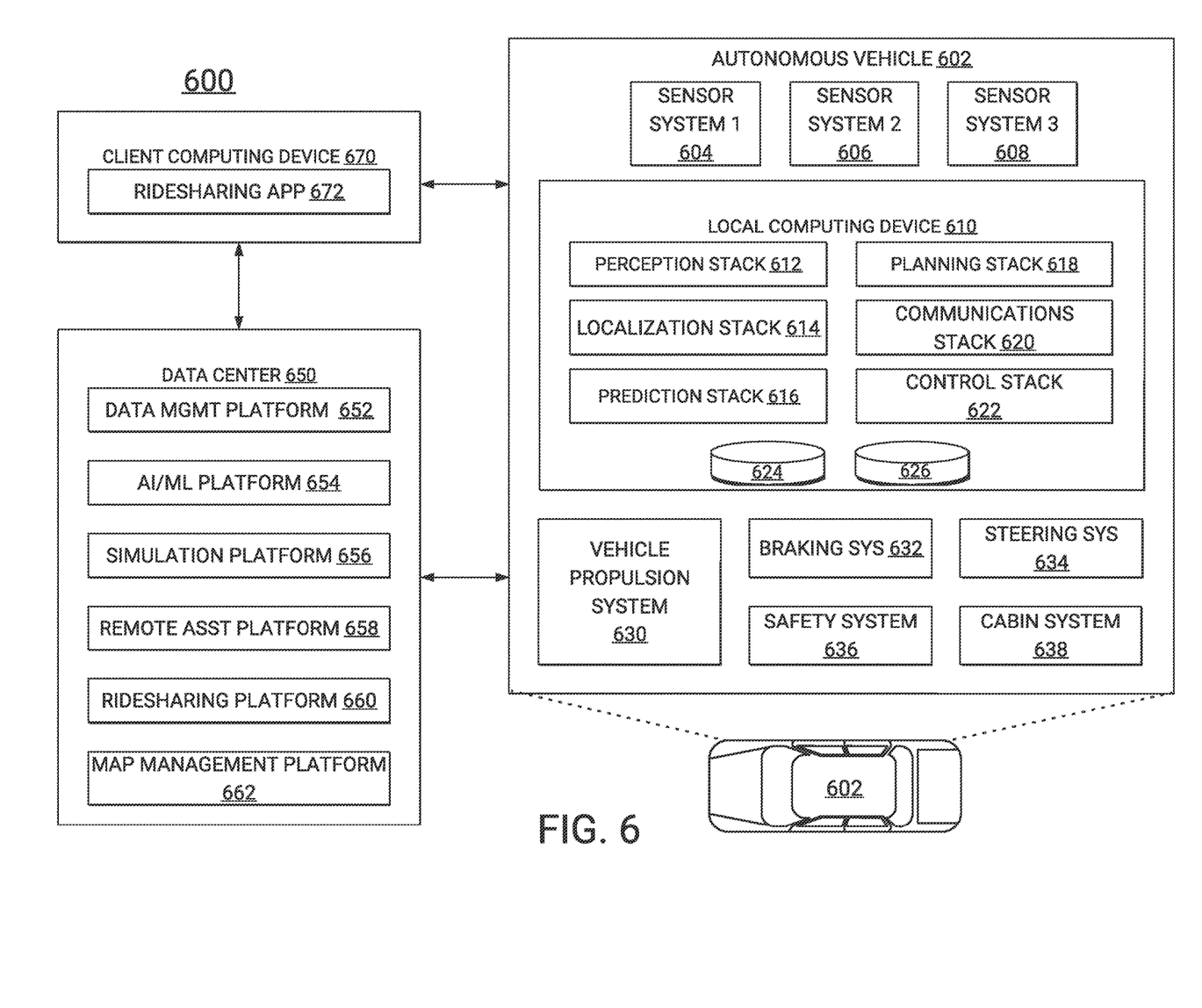
FIG. 6 illustrates an example system environment that can be used to facilitate AV dispatch and operations, according to some aspects of the disclosed technology.

FIG. 6 illustrates an example of an AV management system 600. One of ordinary skill in the art will understand that, for the AV management system 600 and any system discussed in the present disclosure, there can be additional or fewer components in similar or alternative configurations. The illustrations and examples provided in the present disclosure are for conciseness and clarity. Other embodiments may include different numbers and/or types of elements, but one of ordinary skill the art will appreciate that such variations do not depart from the scope of the present disclosure.

In this example, the AV management system 600 includes an AV 602, a data center 150, and a client computing device 170. The AV 602, the data center 650, and the client computing device 670 can communicate with one another over one or more networks (not shown), such as a public network (e.g., the Internet, an Infrastructure as a Service (IaaS) network, a Platform as a Service (PaaS) network, a Software as a Service (SaaS) network, other Cloud Service Provider (CSP) network, etc.), a private network (e.g., a Local Area Network (LAN), a private cloud, a Virtual Private Network (VPN), etc.), and/or a hybrid network (e.g., a multi-cloud or hybrid cloud network, etc.).

AV 602 can navigate roadways without a human driver based on sensor signals generated by multiple sensor systems 604, 606, and 608. The sensor systems 604-608 can include different types of sensors and can be arranged about the AV 602. For instance, the sensor systems 604-608 can comprise Inertial Measurement Units (IMUs), cameras (e.g., still image cameras, video cameras, etc.), optical sensors (e.g., LIDAR systems, ambient light sensors, infrared sensors, etc.), RADAR systems, GPS receivers, audio sensors (e.g., microphones, Sound Navigation and Ranging (SONAR) systems, ultrasonic sensors, etc.), engine sensors, speedometers, tachometers, odometers, altimeters, tilt sensors, impact sensors, airbag sensors, seat occupancy sensors, open/closed door sensors, tire pressure sensors, rain sensors, and so forth. For example, the sensor system 604 can be a camera system, the sensor system 606 can be a LIDAR system, and the sensor system 608 can be a RADAR system. Other embodiments may include any other number and type of sensors.

The AV 602 can also include several mechanical systems that can be used to maneuver or operate the AV 602. For instance, the mechanical systems can include a vehicle propulsion system 630, a braking system 632, a steering system 634, a safety system 636, and a cabin system 638, among other systems. The vehicle propulsion system 630 can include an electric motor, an internal combustion engine, or both. The braking system 632 can include an engine brake, brake pads, actuators, and/or any other suitable componentry configured to assist in decelerating the AV 602. The steering system 634 can include suitable componentry configured to control the direction of movement of the AV 602 during navigation. The safety system 636 can include lights and signal indicators, a parking brake, airbags, and so forth. The cabin system 638 can include cabin temperature control systems, in-cabin entertainment systems, and so forth. In some embodiments, the AV 602 might not include human driver actuators (e.g., steering wheel, handbrake, foot brake pedal, foot accelerator pedal, turn signal lever, window wipers, etc.) for controlling the AV 602. Instead, the cabin system 638 can include one or more client interfaces (e.g., Graphical User Interfaces (GUIs), Voice User Interfaces (VUIs), etc.) for controlling certain aspects of the mechanical systems 630-638.

The AV 602 can additionally include a local computing device 610 that is in communication with the sensor systems 604-608, the mechanical systems 630-638, the data center 650, and the client computing device 670, among other systems. The local computing device 610 can include one or more processors and memory, including instructions that can be executed by the one or more processors. The instructions can make up one or more software stacks or components responsible for controlling the AV 602; communicating with the data center 650, the client computing device 670, and other systems; receiving inputs from riders, passengers, and other entities within the AV's environment; logging metrics collected by the sensor systems 604-608; and so forth. In this example, the local computing device 610 includes a perception stack 612, a mapping and localization stack 614, a prediction stack 616, a planning stack 618, a communications stack 620, a control stack 622, an AV operational database 624, and an HD geospatial database 626, among other stacks and systems.

The perception stack 612 can enable the AV 602 to "see" (e.g., via cameras, LIDAR sensors, infrared sensors, etc.), "hear" (e.g., via microphones, ultrasonic sensors, RADAR, etc.), and "feel" (e.g., pressure sensors, force sensors, impact sensors, etc.) its environment using information from the sensor systems 604-608, the mapping and localization stack 614, the HD geospatial database 626, other components of the AV, and other data sources (e.g., the data center 650, the client computing device 670, third party data sources, etc.). The perception stack 612 can detect and classify objects and determine their current locations, speeds, directions, and the like. In addition, the perception stack 612 can determine the free space around the AV 602 (e.g., to maintain a safe distance from other objects, change lanes, park the AV, etc.). The perception stack 612 can also identify environmental uncertainties, such as where to look for moving objects, flag areas that may be obscured or blocked from view, and so forth. In some embodiments, an output of the prediction stack can be a bounding area around a perceived object that can be associated with a semantic label that identifies the type of object that is within the bounding area, the kinematic of the object (information about its movement), a tracked path of the object, and a description of the pose of the object (its orientation or heading, etc.).

Mapping and localization stack 614 can determine the AV's position and orientation (pose) using different methods from multiple systems (e.g., GPS, IMUs, cameras, LIDAR, RADAR, ultrasonic sensors, the HD geospatial database 626, etc.). For example, in some embodiments, the AV 602 can compare sensor data captured in real-time by the sensor systems 604-608 to data in the HD geospatial database 626 to determine its precise (e.g., accurate to the order of a few centimeters or less) position and orientation. The AV 602 can focus its search based on sensor data from one or more first sensor systems (e.g., GPS) by matching sensor data from one or more second sensor systems (e.g., LIDAR). If the mapping and localization information from one system is unavailable, the AV 602 can use mapping and localization information from a redundant system and/or from remote data sources.

The prediction stack 616 can receive information from the localization stack 614 and objects identified by the perception stack 612 and predict a future path for the objects. In some embodiments, the prediction stack 616 can output several likely paths that an object is predicted to take along with a probability associated with each path. For each predicted path, the prediction stack 616 can also output a range of points along the path corresponding to a predicted location of the object along the path at future time intervals along with an expected error value for each of the points that indicates a probabilistic deviation from that point.

The planning stack 618 can determine how to maneuver or operate the AV 602 safely and efficiently in its environment. For example, the planning stack 618 can receive the location, speed, and direction of the AV 602, geospatial data, data regarding objects sharing the road with the AV 602 (e.g., pedestrians, bicycles, vehicles, ambulances, buses, cable cars, trains, traffic lights, lanes, road markings, etc.) or certain events occurring during a trip (e.g., emergency vehicle blaring a siren, intersections, occluded areas, street closures for construction or street repairs, double-parked cars, etc.), traffic rules and other safety standards or practices for the road, user input, and other relevant data for directing the AV 602 from one point to another and outputs from the perception stack 612, localization stack 614, and prediction stack 616. The planning stack 618 can determine multiple sets of one or more mechanical operations that the AV 602 can perform (e.g., go straight at a specified rate of acceleration, including maintaining the same speed or decelerating; turn on the left blinker, decelerate if the AV is above a threshold range for turning, and turn left; turn on the right blinker, accelerate if the AV is stopped or below the threshold range for turning, and turn right; decelerate until completely stopped and reverse; etc.), and select the best one to meet changing road conditions and events. If something unexpected happens, the planning stack 618 can select from multiple backup plans to carry out. For example, while preparing to change lanes to turn right at an intersection, another vehicle may aggressively cut into the destination lane, making the lane change unsafe. The planning stack 618 could have already determined an alternative plan for such an event. Upon its occurrence, it could help direct the AV 602 to go around the block instead of blocking a current lane while waiting for an opening to change lanes.

The control stack 622 can manage the operation of the vehicle propulsion system 630, the braking system 632, the steering system 634, the safety system 636, and the cabin system 638. The control stack 622 can receive sensor signals from the sensor systems 604-608 as well as communicate with other stacks or components of the local computing device 610 or a remote system (e.g., the data center 650) to effectuate operation of the AV 602. For example, the control stack 622 can implement the final path or actions from the multiple paths or actions provided by the planning stack 618. This can involve turning the routes and decisions from the planning stack 618 into commands for the actuators that control the AV's steering, throttle, brake, and drive unit.

The communications stack 620 can transmit and receive signals between the various stacks and other components of the AV 602 and between the AV 602, the data center 650, the client computing device 670, and other remote systems. The communications stack 620 can enable the local computing device 610 to exchange information remotely over a network, such as through an antenna array or interface that can provide a metropolitan WIFI network connection, a mobile or cellular network connection (e.g., Third Generation (3G), Fourth Generation (4G), Long-Term Evolution (LTE), 5th Generation (5G), etc.), and/or other wireless network connection (e.g., License Assisted Access (LAA), Citizens Broadband Radio Service (CBRS), MULTEFIRE, etc.). The communications stack 620 can also facilitate the local exchange of information, such as through a wired connection (e.g., a user's mobile computing device docked in an in-car docking station or connected via Universal Serial Bus (USB), etc.) or a local wireless connection (e.g., Wireless Local Area Network (WLAN), Bluetooth®, infrared, etc.).

The HD geospatial database 626 can store HD maps and related data of the streets upon which the AV 602 travels. In some embodiments, the HD maps and related data can comprise multiple layers, such as an areas layer, a lanes and boundaries layer, an intersections layer, a traffic controls layer, and so forth. The areas layer can include geospatial information indicating geographic areas that are drivable (e.g., roads, parking areas, shoulders, etc.) or not drivable (e.g., medians, sidewalks, buildings, etc.), drivable areas that constitute links or connections (e.g., drivable areas that form the same road) versus intersections (e.g., drivable areas where two or more roads intersect), and so on. The lanes and boundaries layer can include geospatial information of road lanes (e.g., lane centerline, lane boundaries, type of lane boundaries, etc.) and related attributes (e.g., direction of travel, speed limit, lane type, etc.). The lanes and boundaries layer can also include 3D attributes related to lanes (e.g., slope, elevation, curvature, etc.). The intersections layer can include geospatial information of intersections (e.g., crosswalks, stop lines, turning lane centerlines and/or boundaries, etc.) and related attributes (e.g., permissive, protected/permissive, or protected only left turn lanes; legal or illegal u-turn lanes; permissive or protected only right turn lanes; etc.). The traffic controls lane can include geospatial information of traffic signal lights, traffic signs, and other road objects and related attributes.

The AV operational database 624 can store raw AV data generated by the sensor systems 604-608, stacks 612-622, and other components of the AV 602 and/or data received by the AV 602 from remote systems (e.g., the data center 650, the client computing device 670, etc.). In some embodiments, the raw AV data can include HD LIDAR point cloud data, image data, RADAR data, GPS data, and other sensor data that the data center 650 can use for creating or updating AV geospatial data or for creating simulations of situations encountered by AV 602 for future testing or training of various machine learning algorithms that are incorporated in the local computing device 610.

The data center 650 can be a private cloud (e.g., an enterprise network, a co-location provider network, etc.), a public cloud (e.g., an Infrastructure as a Service (IaaS) network, a Platform as a Service (PaaS) network, a Software as a Service (SaaS) network, or other Cloud Service Provider (CSP) network), a hybrid cloud, a multi-cloud, and so forth. The data center 650 can include one or more computing devices remote to the local computing device 610 for managing a fleet of AVs and AV-related services. For example, in addition to managing the AV 602, the data center 650 may also support a ridesharing service, a delivery service, a remote/roadside assistance service, street services (e.g., street mapping, street patrol, street cleaning, street metering, parking reservation, etc.), and the like.

The data center 650 can send and receive various signals to and from the AV 602 and the client computing device 670. These signals can include sensor data captured by the sensor systems 604-608, roadside assistance requests, software updates, ridesharing pick-up and drop-off instructions, and so forth. In this example, the data center 650 includes a data management platform 652, an Artificial Intelligence/Machine Learning (AI/ML) platform 654, a simulation platform 656, a remote assistance platform 658, and a ridesharing platform 660, and a map management platform 662, among other systems.

The data management platform 652 can be a "big data" system capable of receiving and transmitting data at high velocities (e.g., near real-time or real-time), processing a large variety of data and storing large volumes of data (e.g., terabytes, petabytes, or more of data). The varieties of data can include data having different structured (e.g., structured, semi-structured, unstructured, etc.), data of different types (e.g., sensor data, mechanical system data, ridesharing service, map data, audio, video, etc.), data associated with different types of data stores (e.g., relational databases, key-value stores, document databases, graph databases, column-family databases, data analytic stores, search engine databases, time series databases, object stores, file systems, etc.), data originating from different sources (e.g., AVs, enterprise systems, social networks, etc.), data having different rates of change (e.g., batch, streaming, etc.), or data having other heterogeneous characteristics. The various platforms and systems of the data center 650 can access data stored by the data management platform 652 to provide their respective services.

The AI/ML platform 654 can provide the infrastructure for training and evaluating machine learning algorithms for operating the AV 602, the simulation platform 656, the remote assistance platform 658, the ridesharing platform 660, the map management platform 662, and other platforms and systems. Using the AI/ML platform 654, data scientists can prepare data sets from the data management platform 652; select, design, and train machine learning models; evaluate, refine, and deploy the models; maintain, monitor, and retrain the models; and so on.

The simulation platform 656 can enable testing and validation of the algorithms, machine learning models, neural networks, and other development efforts for the AV 602, the remote assistance platform 658, the ridesharing platform 660, the map management platform 662, and other platforms and systems. The simulation platform 656 can replicate a variety of driving environments and/or reproduce real-world scenarios from data captured by the AV 602, including rendering geospatial information and road infrastructure (e.g., streets, lanes, crosswalks, traffic lights, stop signs, etc.) obtained from a cartography platform (e.g., map management platform 662); modeling the behavior of other vehicles, bicycles, pedestrians, and other dynamic elements; simulating inclement weather conditions, different traffic scenarios; and so on.

The remote assistance platform 658 can generate and transmit instructions regarding the operation of the AV 602. For example, in response to an output of the AI/ML platform 654 or other system of the data center 650, the remote assistance platform 658 can prepare instructions for one or more stacks or other components of the AV 602.

The ridesharing platform 660 can interact with a customer of a ridesharing service via a ridesharing application 672 executing on the client computing device 670. The client computing device 670 can be any type of computing system, including a server, desktop computer, laptop, tablet, smartphone, smart wearable device (e.g., smartwatch, smart eyeglasses or other Head-Mounted Display (HMD), smart ear pods, or other smart in-ear, on-ear, or over-ear device, etc.), gaming system, or other general purpose computing device for accessing the ridesharing application 672. The client computing device 670 can be a customer's mobile computing device or a computing device integrated with the AV 602 (e.g., the local computing device 610). The ridesharing platform 660 can receive requests to pick up or drop off from the ridesharing application 672 and dispatch the AV 602 for the trip.

Map management platform 662 can provide a set of tools for the manipulation and management of geographic and spatial (geospatial) and related attribute data. The data management platform 652 can receive LIDAR point cloud data, image data (e.g., still image, video, etc.), RADAR data, GPS data, and other sensor data (e.g., raw data) from one or more AVs 602, Unmanned Aerial Vehicles (UAVs), satellites, third-party mapping services, and other sources of geospatially referenced data. The raw data can be processed, and map management platform 662 can render base representations (e.g., tiles (2D), bounding volumes (3D), etc.) of the AV geospatial data to enable users to view, query, label, edit, and otherwise interact with the data. Map management platform 662 can manage workflows and tasks for operating on the AV geospatial data. Map management platform 662 can control access to the AV geospatial data, including granting or limiting access to the AV geospatial data based on user-based, role-based, group-based, task-based, and other attribute-based access control mechanisms. Map management platform 662 can provide version control for the AV geospatial data, such as to track specific changes that (human or machine) map editors have made to the data and to revert changes when necessary. Map management platform 662 can administer release management of the AV geospatial data, including distributing suitable iterations of the data to different users, computing devices, AVs, and other consumers of HD maps. Map management platform 662 can provide analytics regarding the AV geospatial data and related data, such as to generate insights relating to the throughput and quality of mapping tasks.

In some embodiments, the map viewing services of map management platform 662 can be modularized and deployed as part of one or more of the platforms and systems of the data center 650. For example, the AI/ML platform 654 may incorporate the map viewing services for visualizing the effectiveness of various object detection or object classification models, the simulation platform 656 may incorporate the map viewing services for recreating and visualizing certain driving scenarios, the remote assistance platform 658 may incorporate the map viewing services for replaying traffic incidents to facilitate and coordinate aid, the ridesharing platform 660 may incorporate the map viewing services into the client application 672 to enable passengers to view the AV 602 in transit en route to a pick-up or drop-off location, and so on.

Figure 7:
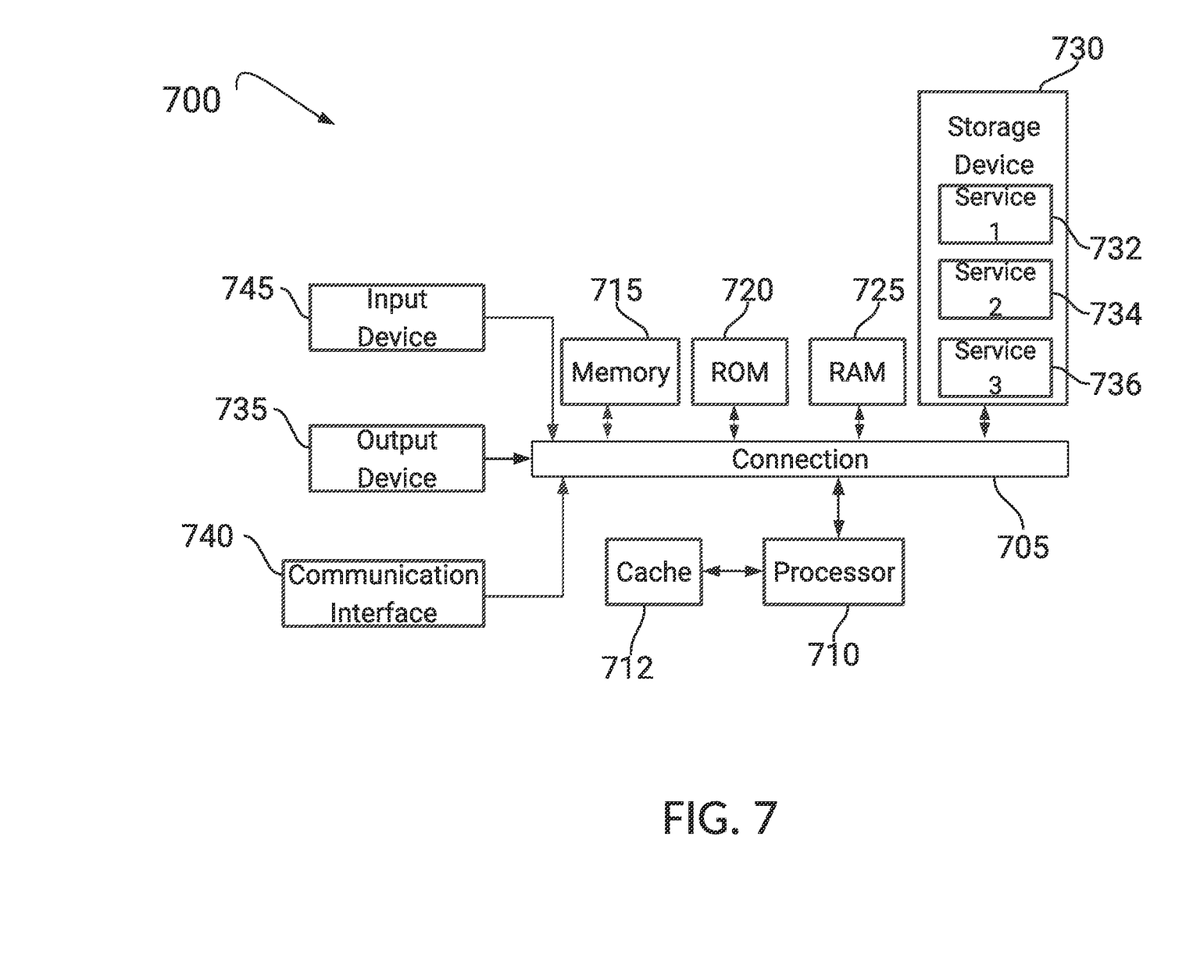
FIG. 7 illustrates an example processor-based system with which some aspects of the subject technology can be implemented.

FIG. 7 illustrates an example apparatus (e.g., a processor-based system) with which some aspects of the subject technology can be implemented. For example, processor-based system 700 can be any computing device making up internal computing system 710, remote computing system 750, a passenger device executing the rideshare app 770, internal computing device 730, or any component thereof in which the components of the system are in communication with each other using connection 705. Connection 705 can be a physical connection via a bus, or a direct connection into processor 710, such as in a chipset architecture. Connection 705 can also be a virtual connection, networked connection, or logical connection.

In some embodiments, computing system 700 is a distributed system in which the functions described in this disclosure can be distributed within a datacenter, multiple data centers, a peer network, etc. In some embodiments, one or more of the described system components represents many such components each performing some or all of the functions for which the component is described. In some embodiments, the components can be physical or virtual devices.

Example system 700 includes at least one processing unit (CPU or processor) 710 and connection 705 that couples various system components including system memory 715, such as read-only memory (ROM) 720 and random-access memory (RAM) 725 to processor 710. Computing system 700 can include a cache of high-speed memory 712 connected directly with, in close proximity to, or integrated as part of processor 710.

Processor 710 can include any general-purpose processor and a hardware service or software service, such as services 732, 734, and 736 stored in storage device 730, configured to control processor 710 as well as a special-purpose processor where software instructions are incorporated into the actual processor design. Processor 710 may essentially be a completely self-contained computing system, containing multiple cores or processors, a bus, memory controller, cache, etc. A multi-core processor may be symmetric or asymmetric.

To enable user interaction, computing system 700 includes an input device 745, which can represent any number of input mechanisms, such as a microphone for speech, a touch-sensitive screen for gesture or graphical input, keyboard, mouse, motion input, speech, etc. Computing system 700 can also include output device 735, which can be one or more of a number of output mechanisms known to those of skill in the art. In some instances, multimodal systems can enable a user to provide multiple types of input/output to communicate with computing system 700. Computing system 700 can include communications interface 740, which can generally govern and manage the user input and system output. The communication interface may perform or facilitate receipt and/or transmission wired or wireless communications via wired and/or wireless transceivers, including those making use of an audio jack/plug, a microphone jack/plug, a universal serial bus (USB) port/plug, an Apple® Lightning® port/plug, an Ethernet port/plug, a fiber optic port/plug, a proprietary wired port/plug, a BLUETOOTH® wireless signal transfer, a BLUETOOTH® low energy (BLE) wireless signal transfer, an IBEACON® wireless signal transfer, a radio-frequency identification (RFID) wireless signal transfer, near-field communications (NFC) wireless signal transfer, dedicated short range communication (DSRC) wireless signal transfer, 802.11 Wi-Fi wireless signal transfer, wireless local area network (WLAN) signal transfer, Visible Light Communication (VLC), Worldwide Interoperability for Microwave Access (WiMAX), Infrared (IR) communication wireless signal transfer, Public Switched Telephone Network (PSTN) signal transfer, Integrated Services Digital Network (ISDN) signal transfer, 3G/4G/5G/LTE cellular data network wireless signal transfer, ad-hoc network signal transfer, radio wave signal transfer, microwave signal transfer, infrared signal transfer, visible light signal transfer, ultraviolet light signal transfer, wireless signal transfer along the electromagnetic spectrum, or some combination thereof.

Communication interface 740 may also include one or more Global Navigation Satellite System (GNSS) receivers or transceivers that are used to determine a location of the computing system 700 based on receipt of one or more signals from one or more satellites associated with one or more GNSS systems. GNSS systems include, but are not limited to, the US-based Global Positioning System (GPS), the Russia-based Global Navigation Satellite System (GLONASS), the China-based BeiDou Navigation Satellite System (BDS), and the Europe-based Galileo GNSS. There is no restriction on operating on any particular hardware arrangement, and therefore the basic features here may easily be substituted for improved hardware or firmware arrangements as they are developed.

Storage device 730 can be a non-volatile and/or non-transitory and/or computer-readable memory device and can be a hard disk or other types of computer readable media which can store data that are accessible by a computer, such as magnetic cassettes, flash memory cards, solid state memory devices, digital versatile disks, cartridges, a floppy disk, a flexible disk, a hard disk, magnetic tape, a magnetic strip/stripe, any other magnetic storage medium, flash memory, memristor memory, any other solid-state memory, a compact disc read only memory (CD-ROM) optical disc, a rewritable compact disc (CD) optical disc, digital video disk (DVD) optical disc, a blu-ray disc (BDD) optical disc, a holographic optical disk, another optical medium, a secure digital (SD) card, a micro secure digital (microSD) card, a Memory Stick® card, a smartcard chip, a EMV chip, a subscriber identity module (SIM) card, a mini/micro/nano/pico SIM card, another integrated circuit (IC) chip/card, random access memory (RAM), static RAM (SRAM), dynamic RAM (DRAM), read-only memory (ROM), programmable read-only memory (PROM), erasable programmable read-only memory (EPROM), electrically erasable programmable read-only memory (EEPROM), flash EPROM (FLASHEPROM), cache memory (L1/L2/L3/L4/L5/L6), resistive random-access memory (RRAM/ReRAM), phase change memory (PCM), spin transfer torque RAM (STT-RAM), another memory chip or cartridge, and/or a combination thereof.

Storage device 730 can include software services, servers, services, etc., that when the code that defines such software is executed by the processor 710, it causes the system to perform a function. In some embodiments, a hardware service that performs a particular function can include the software component stored in a computer-readable medium in connection with the necessary hardware components, such as processor 710, connection 705, output device 735, etc., to carry out the function.

Embodiments within the scope of the present disclosure may also include tangible and/or non-transitory computer-readable storage media or devices for carrying or having computer-executable instructions or data structures stored thereon. Such tangible computer-readable storage devices can be any available device that can be accessed by a general purpose or special purpose computer, including the functional design of any special purpose processor as described above. By way of example, and not limitation, such tangible computer-readable devices can include RAM, ROM, EEPROM, CD-ROM or other optical disk storage, magnetic disk storage or other magnetic storage devices, or any other device which can be used to carry or store desired program code in the form of computer-executable instructions, data structures, or processor chip design. When information or instructions are provided via a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable storage devices.

Computer-executable instructions include, for example, instructions and data which cause a general-purpose computer, special purpose computer, or special purpose processing device to perform a certain function or group of functions. Computer-executable instructions also include program modules that are executed by computers in stand-alone or network environments. Generally, program modules include routines, programs, components, data structures, objects, and the functions inherent in the design of special-purpose processors, etc. that perform tasks or implement abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Other embodiments of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

The various embodiments described above are provided by way of illustration only and should not be construed to limit the scope of the disclosure. For example, the principles herein apply equally to optimization as well as general improvements. Various modifications and changes may be made to the principles described herein without following the example embodiments and applications illustrated and described herein, and without departing from the spirit and scope of the disclosure. Claim language reciting "at least one of" a set indicates that one member of the set or multiple members of the set satisfy the claim.

What is claimed is:

1. An apparatus comprising: at least one memory; and
at least one processor coupled to the at least one memory, the at least one processor configured to:
associate a set of test metrics with an autonomous vehicle (AV) test, wherein the set of test metrics comprises an indication of one or more target AV behaviors to be checked when performing the AV test, and wherein the one or more target AV behaviors comprises at least one AV maneuver that is to be verified by the AV test;
monitor operation of an AV in a simulated environment to identify one or more behaviors performed by the AV in the simulated environment;
determine a validity of the AV test with respect to the simulated environment based on the set of test metrics;
determine that the AV test is invalid; and
determine if the AV test can be fixed by changing an evaluation window associated with the test.

2. The apparatus of claim 1, wherein to determine if the AV test can be fixed by changing an evaluation window, the at least one processor is further configured to:
provide the AV test to a machine-learning model; and
receive, from the machine-learning model, a classification output indicating whether or not the AV test can be updated by changing the evaluation window.

3. The apparatus of claim 1, wherein to determine the validity of the AV test with respect to the simulated environment, the at least one processor is further configured to determine if the one or more behaviors performed by the AV correspond with an intent path associated with the AV test.

4. The apparatus of claim 1, wherein the one or more target AV behaviors comprises at least one of a distance requirement, a maneuver requirement, an AV speed requirement, or an environmental zone requirement.

5. The apparatus of claim 1, wherein operation of the AV in the simulated environment is based on driving data collected for the AV.

6. The apparatus of claim 5, wherein the driving data comprises at least one of Light Detection and Ranging (LiDAR) data, Radio Detection and Ranging (RADAR) data, or camera data.

7. A computer-implemented method, comprising:
associating a set of test metrics with an autonomous vehicle (AV) test, wherein the set of test metrics comprises an indication of one or more target AV behaviors to be checked when performing the AV test, and wherein the one or more target AV behaviors comprises at least one AV maneuver that is to be verified by the AV test;
monitoring operation of an AV in a simulated environment to identify one or more behaviors performed by the AV in the simulated environment;
determining a validity of the AV test with respect to the simulated environment based on the set of test metrics;
determining that the AV test is invalid; and
determining if the AV test can be fixed by changing an evaluation window associated with the test.

8. The computer-implemented method of claim 7, wherein determining if the AV test can be fixed, further comprises:
providing the AV test to a machine-learning model; and
receiving, from the machine-learning model, a classification output indicating whether or not the AV test can be updated by changing the evaluation window.

9. The computer-implemented method of claim 7, wherein determining the validity of the AV test with respect to the simulated environment, further comprises determining if the one or more behaviors performed by the AV correspond with an intent path associated with the AV test.

10. The computer-implemented method of claim 7, wherein the one or more target AV behaviors comprises at least one of a distance requirement, a maneuver requirement, an AV speed requirement, or an environmental zone requirement.

11. The computer-implemented method of claim 7, wherein operation of the AV in the simulated environment is based on driving data collected for the AV.

12. The computer-implemented method of claim 11, wherein the driving data comprises at least one of Light Detection and Ranging (LiDAR) data, Radio Detection and Ranging (RADAR) data, or camera data.

13. A non-transitory computer-readable storage medium comprising at least one instruction for causing a computer or processor to:
associate a set of test metrics with an autonomous vehicle (AV) test, wherein the set of test metrics comprises an indication of one or more target AV behaviors to be checked when performing the AV test, and wherein the one or more target AV behaviors comprises at least one AV maneuver that is to be verified by the AV test;
monitor operation of an AV in a simulated environment to identify one or more behaviors performed by the AV in the simulated environment;
determine a validity of the AV test with respect to the simulated environment based on the set of test metrics; and
determine that the AV test is invalid; and
determine if the AV test can be fixed by changing an evaluation window associated with the test.

14. The non-transitory computer-readable storage medium of claim 13, wherein to determine if the AV test can be fixed by changing an evaluation window, the at least one instruction is further configured to cause the processor to:
provide the AV test to a machine-learning model; and
receive, from the machine-learning model, a classification output indicating whether or not the AV test be can updated by changing the evaluation window.

15. The non-transitory computer-readable storage medium of claim 13, wherein to determine the validity of the AV test with respect to the simulated environment, the at least one instruction is further configured to cause the processor to determine if the one or more behaviors performed by the AV correspond with an intent path associated with the AV test.

16. The non-transitory computer-readable storage medium of claim 13, wherein the one or more target AV behaviors comprises at least one of a distance requirement, a maneuver requirement, an AV speed requirement, or an environmental zone requirement.

17. The non-transitory computer-readable storage medium of claim 13, wherein operation of the AV in the simulated environment is based on driving data collected for the AV.

* * * * *